US010679910B2

(12) United States Patent
Tanaka et al.

(10) Patent No.: US 10,679,910 B2
(45) Date of Patent: Jun. 9, 2020

(54) PACKAGED WAFER PROCESSING METHOD

(71) Applicant: DISCO CORPORATION, Tokyo (JP)

(72) Inventors: Makoto Tanaka, Tokyo (JP); Xin Lu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 108 days.

(21) Appl. No.: 15/417,642

(22) Filed: Jan. 27, 2017

(65) Prior Publication Data
US 2017/0221780 A1    Aug. 3, 2017

(30) Foreign Application Priority Data

Jan. 28, 2016  (JP) .................................. 2016-014090

(51) Int. Cl.
| | |
|---|---|
| *H01L 21/66* | (2006.01) |
| *H01L 21/67* | (2006.01) |
| *B23K 26/364* | (2014.01) |
| *B23K 26/03* | (2006.01) |
| *B23K 26/08* | (2014.01) |
| *H01L 21/687* | (2006.01) |

(Continued)

(52) U.S. Cl.
CPC ............ *H01L 22/20* (2013.01); *B23K 26/032* (2013.01); *B23K 26/0853* (2013.01); *B23K 26/364* (2015.10); *H01L 21/67051* (2013.01); *H01L 21/67092* (2013.01); *H01L 21/68764* (2013.01); *H01L 21/78* (2013.01); *B23K 2101/40* (2018.08); *H01L 22/12* (2013.01); *H01L 2223/5446* (2013.01)

(58) Field of Classification Search
USPC ............................................... 438/5
See application file for complete search history.

(56) References Cited

U.S. PATENT DOCUMENTS

| | | | |
|---|---|---|---|
| 7,863,160 B2 * | 1/2011 | Iizuka ................ | B23K 26/0648 |
| | | | 438/463 |
| 2013/0068736 A1 * | 3/2013 | Mielke .................. | B23K 26/38 |
| | | | 219/121.71 |

(Continued)

FOREIGN PATENT DOCUMENTS

| | | | | |
|---|---|---|---|---|
| JP | 2002192370 A | * | 7/2002 | ......... B23K 26/0057 |
| JP | 2012-028635 | | 2/2012 | |
| JP | 2012028635 A | * | 2/2012 | |

*Primary Examiner* — Mohammad M Hoque
(74) *Attorney, Agent, or Firm* — Greer Burns & Crain, Ltd.

(57) ABSTRACT

A packaged wafer processing method includes a processing step of processing each division line formed on a packaged wafer by using a laser beam applying unit and a feeding mechanism, and indexing the wafer by a preset index amount "a" corresponding to the pitch of the division lines by using an indexing mechanism, thereby forming a laser processed groove along each division line. A correcting step images the next division line to be processed in an exposed peripheral portion of the wafer and the laser processed groove just formed along the present division line, at any arbitrary time during the processing step. The distance "b" between the next division line and the laser processed groove just formed is determined, and then a correction index amount "c" is calculated by using the deviation corresponding to the difference (a–b) between the preset index amount "a" and the distance "b".

11 Claims, 5 Drawing Sheets

(51) Int. Cl.
*H01L 21/78* (2006.01)
*B23K 101/40* (2006.01)

(56) References Cited

U.S. PATENT DOCUMENTS

2013/0149841 A1* 6/2013 Indyk ...................... H01L 24/27
                                                          438/462
2016/0332260 A1* 11/2016 Odanaka ............... B23K 26/364
2017/0014947 A1* 1/2017 Odagiri ................ B23K 26/032

* cited by examiner

PACKAGED WAFER PROCESSING METHOD

BACKGROUND OF THE INVENTION

Field of the Invention

The present invention relates to a packaged wafer processing method of processing a packaged wafer having a front side sealed with a resin.

Description of the Related Art

A packaged wafer is formed by sealing the front side of a wafer such as a semiconductor wafer and a ceramic substrate with a resin. The packaged wafer is processed by using a processing apparatus (laser processing apparatus) including a laser beam applying unit for applying a laser beam, thereby dividing the packaged wafer into a plurality of packaged devices. Prior to processing the packaged wafer by using the processing apparatus, alignment must be performed to make the processing apparatus recognize the position and orientation of the packaged wafer.

In performing the alignment, an area of the packaged wafer not covered with the resin is first imaged by an imaging unit to find a pattern coinciding with a characteristic key pattern (target pattern) previously stored in the processing apparatus. Thereafter, the orientation of the packaged wafer is adjusted according to the pattern found above. Further, the position of an actual division line is specified according to the distance between each division line (street) and the corresponding key pattern previously stored in the processing apparatus. Thereafter, a laser beam is applied according to this specified position to thereby allow the processing of the packaged wafer along the target division line. The processing apparatus further previously stores the spacing (distance) between any two adjacent division lines. Accordingly, after processing the packaged wafer along the target division line, the laser beam applying unit and the packaged wafer are relatively moved (indexed) according to the above spacing stored. As a result, the laser beam applying unit is positioned directly above the next division line adjacent to the above target division line previously processed, and the packaged wafer is then processed along this next division line. The application of the laser beam and the relative movement (indexing) of the laser beam applying unit and the packaged wafer are repeated until the packaged wafer is processed along all of the other division lines.

However, during the processing of the packaged wafer, there is a possibility that the position of the laser beam applying unit may be deviated from the lateral center of the target division line due to any error inherent in the processing apparatus or heat generated during the processing, for example. To cope with this problem, there has been proposed a method of correcting the position of the laser beam applying unit according to the distance between a laser processed groove (kerf) formed by the processing and the key pattern mentioned above (see Japanese Patent Laid-Open No. 2012-28635, for example).

SUMMARY OF THE INVENTION

However, in processing a packaged wafer with a small number of key patterns exposed, the position of the laser beam applying unit with respect to each division line cannot always be properly corrected by the above method.

It is therefore an object of the present invention to provide a packaged wafer processing method which can properly correct the position of the laser beam applying unit with respect to each division line even in processing a packaged wafer with a small number of key patterns exposed.

In accordance with an aspect of the present invention, there is provided a packaged wafer processing method of processing a packaged wafer by using a processing apparatus, the packaged wafer being composed of a wafer and a resin sealing a front side of the wafer in an area except a peripheral portion, the front side of the wafer being partitioned into a plurality of separate regions by a plurality of crossing division lines, wherein a device having a key pattern is formed in each separate region, the processing apparatus including a rotatable holding table for holding the packaged wafer, a laser beam applying unit for applying a laser beam having an absorption wavelength to the packaged wafer held on the holding table, a feeding mechanism for relatively moving the holding table and the laser beam applying unit in an X direction, an indexing mechanism for relatively moving the holding table and the laser beam applying unit in a Y direction perpendicular to the X direction, an imaging unit for imaging and detecting a target area of the packaged wafer to be processed, and a control unit for controlling the holding table, the laser beam applying unit, the feeding mechanism, the indexing mechanism, and the imaging unit. The packaged wafer processing method includes an alignment step of imaging the target area of the packaged wafer held on the holding table by using the imaging unit to make the direction of the division lines parallel to the X direction, a processing step of processing each division line by using the laser beam applying unit and the feeding mechanism and indexing the packaged wafer by a preset index amount a corresponding to the pitch of the division lines by using the indexing mechanism after performing the alignment step, thereby forming a laser processed groove along each division line, and a correcting step of imaging a next division line to be processed in the peripheral portion of the wafer and the laser processed groove just formed along the present division line, at any arbitrary time during the processing step, next determining a distance b between the next division line and the laser processed groove formed along the present division line, and then calculating a correction index amount c by using a deviation corresponding to a difference (a−b) between the preset index amount a and the distance b.

In accordance with an aspect of the present invention, the correcting step may include imaging the laser processed groove formed in the resin.

In the packaged wafer processing method according to the present invention, the next division line to be processed and the laser processed groove just formed along the present division line are imaged in the exposed peripheral portion of the packaged wafer to determine the distance b between the next division line and the laser processed groove formed along the present division line. Thereafter, the correction index amount c is calculated by using the deviation corresponding to the difference (a−b) between the index amount a and the distance b. Accordingly, it is unnecessary to use the key patterns in the correcting step. That is, even in processing the packaged wafer with a small number of key patterns exposed, the position of the laser beam applying unit with respect to each division line can be properly corrected. Further, the distance b as an actual index amount is directly measured by imaging the division lines without using the key patterns, so that the position of the laser beam applying unit with respect to each division line can be corrected more reliably with high accuracy. Thusly, according to the packaged wafer processing method of the present invention, even in processing the packaged wafer with a small number of key patterns exposed, the position of the laser beam applying unit with respect to each division line can be properly corrected.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The packaged wafer processing method according to the preferred embodiment includes an alignment step (see FIG. 3A), a processing step (see FIG. 3B), and a correcting step (see FIG. 4). In the alignment step, a target area of the packaged wafer to be processed is imaged to make the direction of division lines (streets) parallel to the X direction (feeding direction). In the processing step, a laser beam applying unit is used to process the packaged wafer to thereby form a laser processed groove along each division line. In the correcting step, a correction index amount for correcting the position of the laser beam applying unit with respect to the next division line to be processed is calculated, according to the distance between this next division line and the laser processed groove just formed along the present division line. The correcting step is performed at any arbitrary time during the processing step. The packaged wafer processing method according to the preferred embodiment will now be described in detail.

Figure 1:
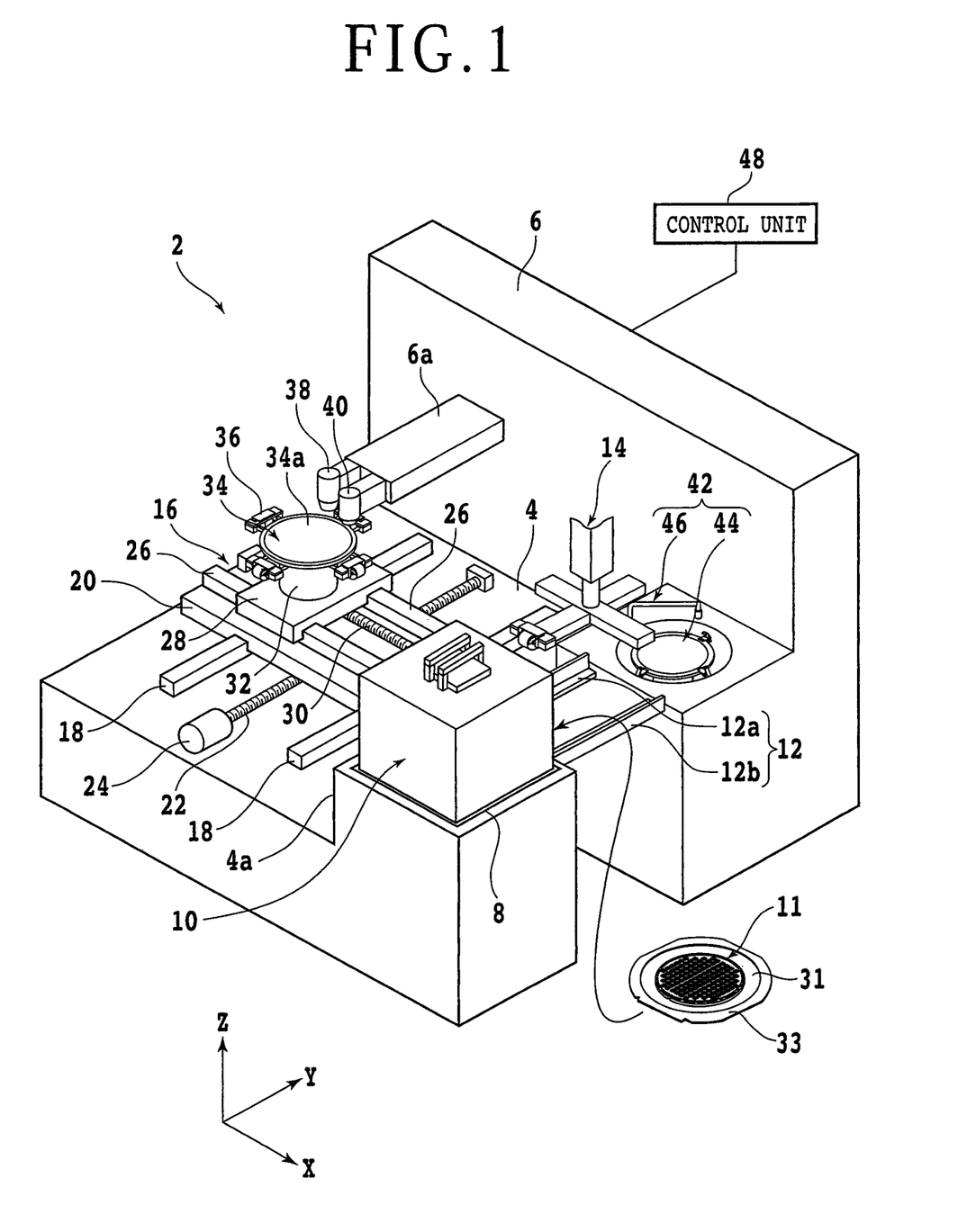
FIG. 1 is a schematic perspective view of a processing apparatus for performing a packaged wafer processing method according to a preferred embodiment of the present invention.

First, there will be described a processing apparatus for performing the packaged wafer processing method according to the preferred embodiment. FIG. 1 is a schematic perspective view of a processing apparatus usable in the preferred embodiment. As shown in FIG. 1, a processing apparatus (laser processing apparatus) 2 includes a base 4 for supporting each structure. A support structure 6 is provided at the rear end of the base 4 so as to extend in a Z direction (vertical direction). A corner portion of the front end of the base 4 as viewed in FIG. 1 is raised to form a cassette mounting portion 4a. A space is defined inside the cassette mounting portion 4a, and a vertically movable cassette elevator 8 is provided in this space. The cassette elevator 8 has an upper surface for mounting a cassette 10. The cassette 10 is capable of storing a plurality of packaged wafers 11, one of which is shown in FIG. 1.

Figure 2A:
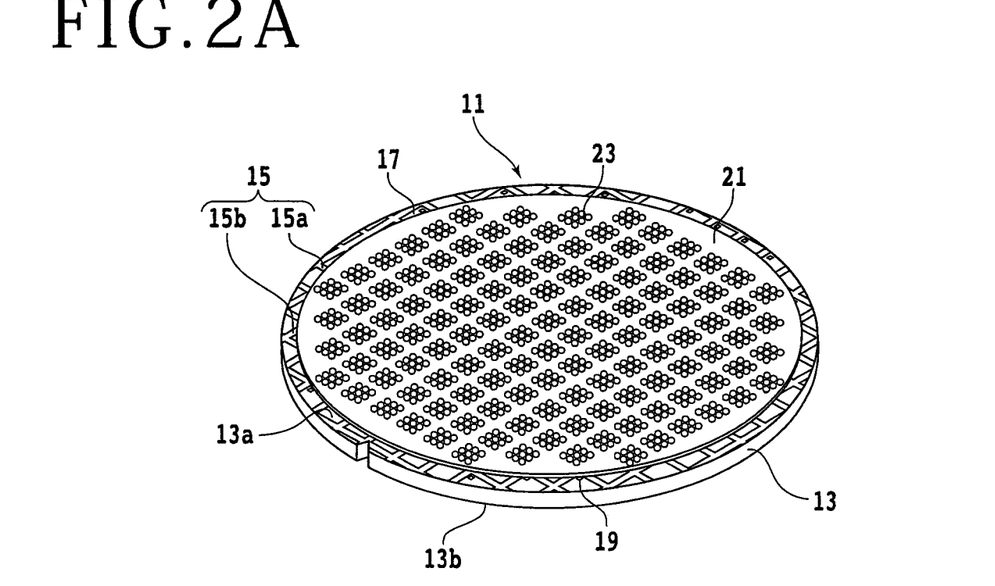
FIG. 2A is a schematic perspective view of a packaged wafer.
Figure 2B:
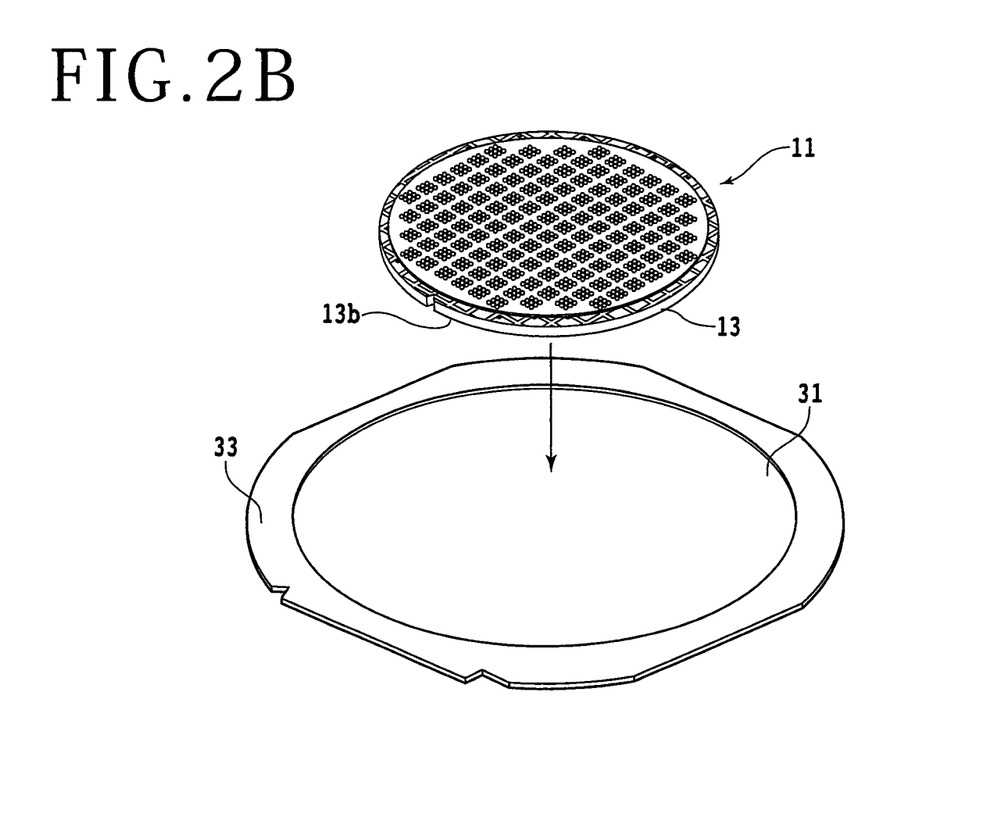
FIG. 2B is a schematic perspective view showing a manner of supporting the packaged wafer through a dicing tape to an annular frame.

FIG. 2A is a schematic perspective view of each packaged wafer 11, and FIG. 2B is a schematic perspective view showing a manner of supporting the packaged wafer 11 through a dicing tape to an annular frame. As shown in FIGS. 2A and 2B, the packaged wafer 11 includes a disk-shaped wafer 13 formed of a material such as silicon (Si), gallium arsenide (GaAs), lithium tantalate ($LiTaO_3$), lithium niobate ($LiNbO_3$), silicon carbide (SiC), and sapphire ($Al_2O_3$). The wafer 13 has a front side 13a and a back side 13b. The front side 13a of the wafer 13 is partitioned into a plurality of separate regions by a plurality of crossing division lines (streets) 15, wherein a device 17 such as integrated circuit (IC), surface acoustic wave (SAW) filter, and light-emitting diode (LED) is formed in each separate region. Each device 17 includes a key pattern (target pattern) 19 having a characteristic shape. In other words, a plurality of such key patterns 19 are regularly arranged on the front side 13a of the wafer 13.

The plural division lines 15 are composed of a plurality of first division lines 15a extending in a first direction and a plurality of second division lines 15b extending in a second direction perpendicular to the first direction. The intervals between any adjacent ones of the first division lines 15a are substantially equal. The intervals between any adjacent ones of the second division lines 15b are substantially equal. The front side 13a of the wafer 13 is sealed with a resin 21 in an area (central portion) except the other area (peripheral portion) in the vicinity of the circumference of the wafer 13. In this area (central portion) of the front side 13a of the wafer 13, the division lines 15, the devices 17, and the key patterns 19 are not exposed. On the other hand, the other area (peripheral portion) of the front side 13a of the wafer 13 is not covered with the resin 21, but the division lines 15, the devices 17, and the key patterns 19 are partially exposed. A plurality of electrodes 23 are provided on the upper surface of the resin 21 at a position corresponding to each device 17. Each electrode 23 is formed of solder or the like.

As shown in FIG. 2B, a dicing tape (adhesive tape) 31 is attached to the lower surface of the packaged wafer (the back side 13b of the wafer 13). The dicing tape 31 has a diameter larger than that of the packaged wafer (the wafer 13). An annular frame 33 is fixed to the peripheral portion of the dicing tape 31. Accordingly, the packaged wafer 11 is supported through the dicing tape 31 to the annular frame 33.

Referring back to FIG. 1, a temporary setting mechanism 12 for temporarily setting the packaged wafer 11 is provided adjacent to the cassette mounting portion 4a in the processing apparatus 2. The temporary setting mechanism 12 includes a pair of parallel guide rails 12a and 12b extending in the Y direction (indexing direction). The guide rails 12a and 12b are movable toward and away from each other in the condition where they remain parallel to each other. Each of the guide rails 12a and 12b has a support surface for supporting the packaged wafer 11 (the annular frame 33) and a side surface substantially perpendicular to the support surface. A transfer mechanism (transfer means) 14 is provided to hold the packaged wafer 11 (the annular frame 33) stored in the cassette 10, pull it out of the cassette 10, and transfer it to the temporary setting mechanism 12. In the temporary setting mechanism 12, the packaged wafer 11 is positioned by moving the guide rails 12a and 12b in the X direction (feeding direction).

A moving mechanism (feeding mechanism and indexing mechanism) 16 is provided at the center of the base 4. The moving mechanism 16 includes a pair of parallel Y guide rails 18 provided on the upper surface of the base 4 so as to extend in the Y direction. A Y moving table 20 is slidably mounted on the Y guide rails 18. A nut portion (not shown) is provided on the back side (lower surface) of the Y moving table 20, and a Y ball screw 22 parallel to the Y guide rails 18 is threadedly engaged with this nut portion. A Y pulse motor 24 is connected to one end of the Y ball screw 22. Accordingly, when the Y pulse motor 24 is operated to rotate the Y ball screw 22, the Y moving table 20 is moved in the Y direction along the Y guide rails 18.

A pair of parallel X guide rails 26 are provided on the front side (upper surface) of the Y moving table 20 so as to extend in the X direction. An X moving table 28 is slidably mounted on the X guide rails 26. A nut portion (not shown) is provided on the back side (lower surface) of the X moving table 28, and an X ball screw 30 parallel to the X guide rails 26 is threadedly engaged with this nut portion. An X pulse motor (not shown) is connected to one end of the X ball screw 30. Accordingly, when the X pulse motor is operated to rotate the X ball screw 30, the X moving table 28 is moved in the X direction along the X guide rails 26.

A table base 32 is provided on the front side (upper surface) of the X moving table 28. A holding table (chuck table) 34 for holding the packaged wafer 11 under suction is provided at the upper portion of the table base 32. Four clamps 36 for fixing the annular frame 33 supporting the packaged wafer 11 are provided on the circumference of the holding table 34 so as to be spaced equally. The holding table 34 is connected to a rotational drive source (not shown) such as a motor, so that the holding table 34 is rotatable about its axis extending in the Z direction (vertical direction). When the moving mechanism 16 is operated to move the X moving table 28 in the X direction, the holding table 34 is fed in the X direction. Further, when the moving mechanism 16 is operated to move the Y moving table 20 in the Y direction, the holding table 34 is indexed in the Y direction. The holding table 34 has an upper surface as a holding surface 34a for holding the packaged wafer 11. The holding surface 34a is substantially parallel to the X direction and the Y direction. A suction passage (not shown) is formed inside the holding table 34 and the table base 32, and this suction passage is connected to a vacuum source (not shown).

A support arm 6a projects from the front side (front surface) of the support structure 6. A laser beam applying unit 38 for downward applying a laser beam is provided at the front end of the support arm 6a. Further, a camera (imaging unit) 40 for imaging the upper surface of the packaged wafer 11 (the front side 13a of the wafer 13) is also provided at the front end of the support arm 6a so as to be arranged adjacent to the laser beam applying unit 38. The laser beam applying unit 38 includes a laser oscillator (not shown) for oscillating a pulsed laser beam having an absorption wavelength to the packaged wafer 11. For example, in the case that the wafer 13 constituting the packaged wafer 11 is formed of a semiconductor material such as silicon, a laser oscillator having a laser medium such as neodymium-doped yttrium aluminum garnet (Nd:YAG) may be used to oscillate a pulsed laser beam having a wavelength of 355 nm. The laser beam applying unit 38 further includes focusing means (not shown) for focusing the pulsed laser beam oscillated from the laser oscillator. The pulsed laser beam focused by the focusing means is applied to the packaged wafer 11 held on the holding table 34. While the laser beam is being applied by the laser beam applying unit 38, the holding table 34 holding the packaged wafer 11 is fed in the X direction, thereby allowing laser processing (ablation) of the packaged wafer 11 to thereby form a laser processed groove extending in the X direction.

The packaged wafer 11 processed by the laser beam applying unit 38 is transferred from the holding table 34 to a cleaning unit 42 by operating the transfer mechanism 14. The cleaning unit 42 includes a spinner table 44 for holding the packaged wafer 11 under suction in a cylindrical cleaning space. A rotational drive source (not shown) for rotating the spinner table 44 at a predetermined speed is connected to the lower portion of the spinner table 44. A cleaning fluid nozzle 46 is provided above the spinner table 44 to spray a cleaning fluid (typically, a mixture of water and air) toward the packaged wafer 11 held on the spinner table 44. By rotating the spinner table 44 holding the packaged wafer 11 and simultaneously spraying the cleaning fluid from the cleaning fluid nozzle 46 toward the packaged wafer 11, the packaged wafer 11 can be cleaned. After cleaning the packaged wafer 11 in the cleaning unit 42, the packaged wafer 11 is transferred to the temporary setting mechanism 12 by operating the transfer mechanism 14 and next stored into the cassette 10.

All the components including the transfer mechanism 14, the moving mechanism 16, the holding table 34, the laser beam applying unit 38, and the camera 40 are connected to a control unit 48. The control unit 48 functions to control each component according to a series of steps required for the processing of the packaged wafer 11.

The packaged wafer processing method to be performed by the processing apparatus 2 mentioned above will now be described. In performing the packaged wafer processing method according to the preferred embodiment, the alignment step is first performed in such a manner that the orientation of the packaged wafer 11 is adjusted so that the direction of the division lines 15 (the first division lines 15a or the second division lines 15b) becomes parallel to the X direction. More specifically, the packaged wafer 11 is transferred to the holding table 34 by the transfer mechanism 14 and then placed on the holding table 34 in the condition where the resin 21 (the front side 13a) is exposed upward. Thereafter, a vacuum is applied from the vacuum source to the holding table 34 to thereby hold the packaged wafer 11 on the holding table 34 under suction.

After holding the packaged wafer 11 on the holding table 34 under suction, the front side (upper surface) of the packaged wafer 11 is imaged by the camera 40. Thereafter, an arbitrary one of the key patterns 19 exposed to the peripheral portion of the packaged wafer 11 corresponding to a predetermined one of the division lines 15 is detected according to information on the coordinates of the key patterns 19 as previously recorded and an image of the packaged wafer 11 obtained by the camera 40. The detection of the key pattern 19 is performed by any method such as pattern matching for finding a shape having high correlation to the shape of each key pattern 19 previously recorded. The packaged wafer 11 is placed on the holding table 34 by the transfer mechanism 14 in the condition where the position and orientation of the packaged wafer 11 fall within a predetermined tolerance. Accordingly, the target key pattern 19 can be detected in a short time by imaging and checking an area in the vicinity of the coordinates of the key patterns 19 previously recorded.

Figure 3A:
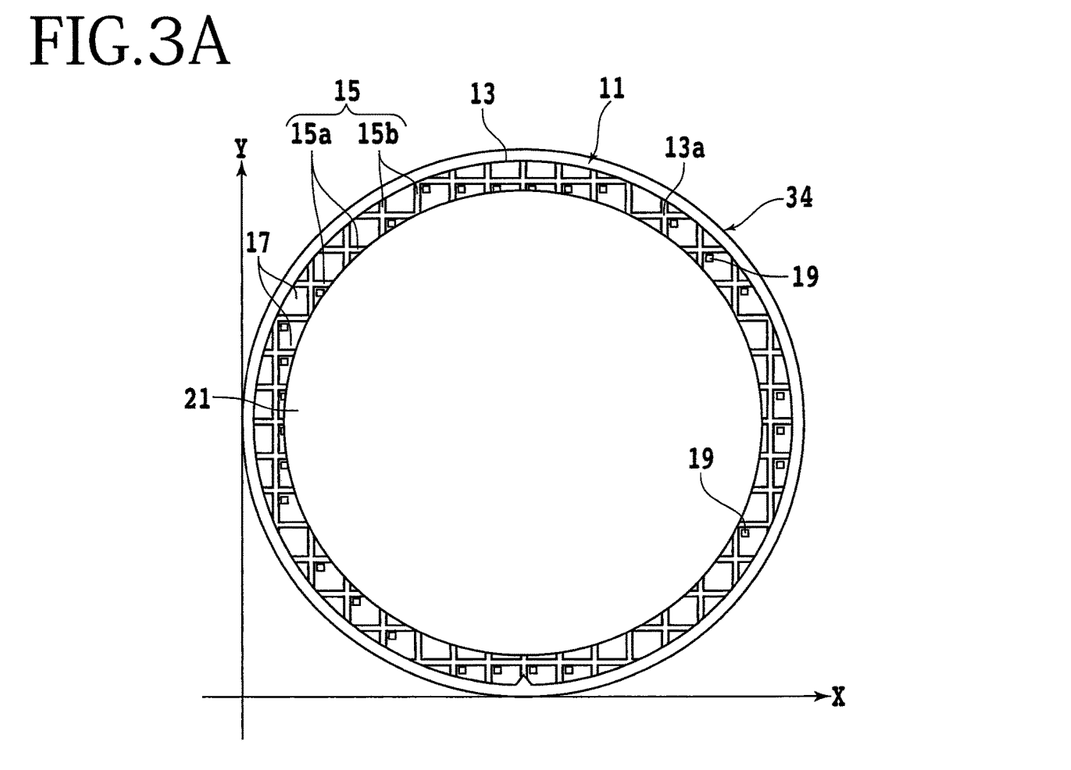
FIG. 3A is a schematic plan view showing the condition of the packaged wafer after performing an alignment step.

Thereafter, the actual coordinates of the detected key pattern 19 are determined from the image, and the direction of the division lines 15 are made parallel to the X direction (feeding direction) according to the coordinate information determined above. More specifically, a proper rotational angle of the holding table 34 is set according to the actual coordinates of the detected key pattern 19, and the holding table 34 is rotated by this angle. FIG. 3A is a schematic plan view showing the condition of the packaged wafer 11 after performing the alignment step. In FIG. 3A, the components of the packaged wafer 11 are partially omitted. In FIG. 3A, the orientation of the packaged wafer 11 is adjusted so that the direction of the first division lines 15a becomes parallel to the X direction.

Figure 3B:
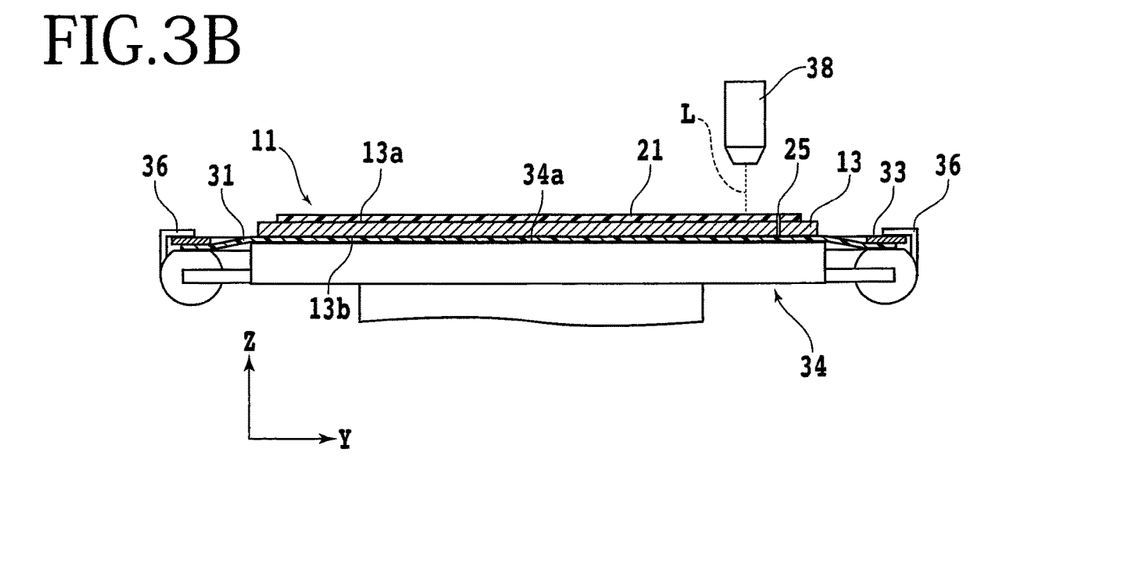
FIG. 3B is a partially sectional side view schematically showing a manner of applying a laser beam to the packaged wafer in a processing step.

After performing the alignment step, the processing step is performed in such a manner that the laser beam (pulsed laser beam) is applied along each division line 15 to process the packaged wafer 11. FIG. 3B is a partially sectional side view schematically showing a manner of applying a laser beam to the packaged wafer 11 in the processing step. In performing the processing step, the holding table 34 is moved and rotated so that the laser beam applying unit 38 is located directly above the extension of a target one of the division lines 15. Thereafter, a laser beam L is applied from the laser beam applying unit 38 to the packaged wafer 11, and at the same time the holding table 34 is fed in the X direction (the holding table 34 and the laser beam applying unit 38 are relatively moved in the X direction). Accordingly, the packaged wafer 11 is processed along the target division line 15 by the laser beam L (ablation) to thereby form a laser processed groove 25 along the target division line 15.

After forming the laser processed groove 25 along the target division line 15 as mentioned above, the holding table 34 is indexed in the Y direction (the holding table 34 and the laser beam applying unit 38 are relatively moved in the Y direction) to thereby locate the laser beam applying unit 38 directly above the extension of the next target division line 15. Thereafter, the laser beam L is applied and at the same time the holding table 34 is fed in the X direction (the holding table 34 and the laser beam applying unit 38 are relatively moved in the X direction) to thereby form a similar laser processed groove 25 along this next target division line 15. This operation is similarly repeated for all of the other division lines 15 to form a plurality of laser processed grooves 25 along all of the other division lines 15. In indexing the holding table 34 in the Y direction, the index amount a of the holding table 34 (the index amount of the moving mechanism (indexing mechanism) 16) is set so as to correspond to the spacing between any adjacent ones of the division lines 15. More specifically, in the case of processing the packaged wafer 11 along the first division lines 15a, the index amount a corresponding to the pitch of the first division lines 15a is set. Further, in the case of processing the packaged wafer 11 along the second division lines 15b, the index amount a corresponding to the pitch of the second division lines 15b is set.

Figure 4:
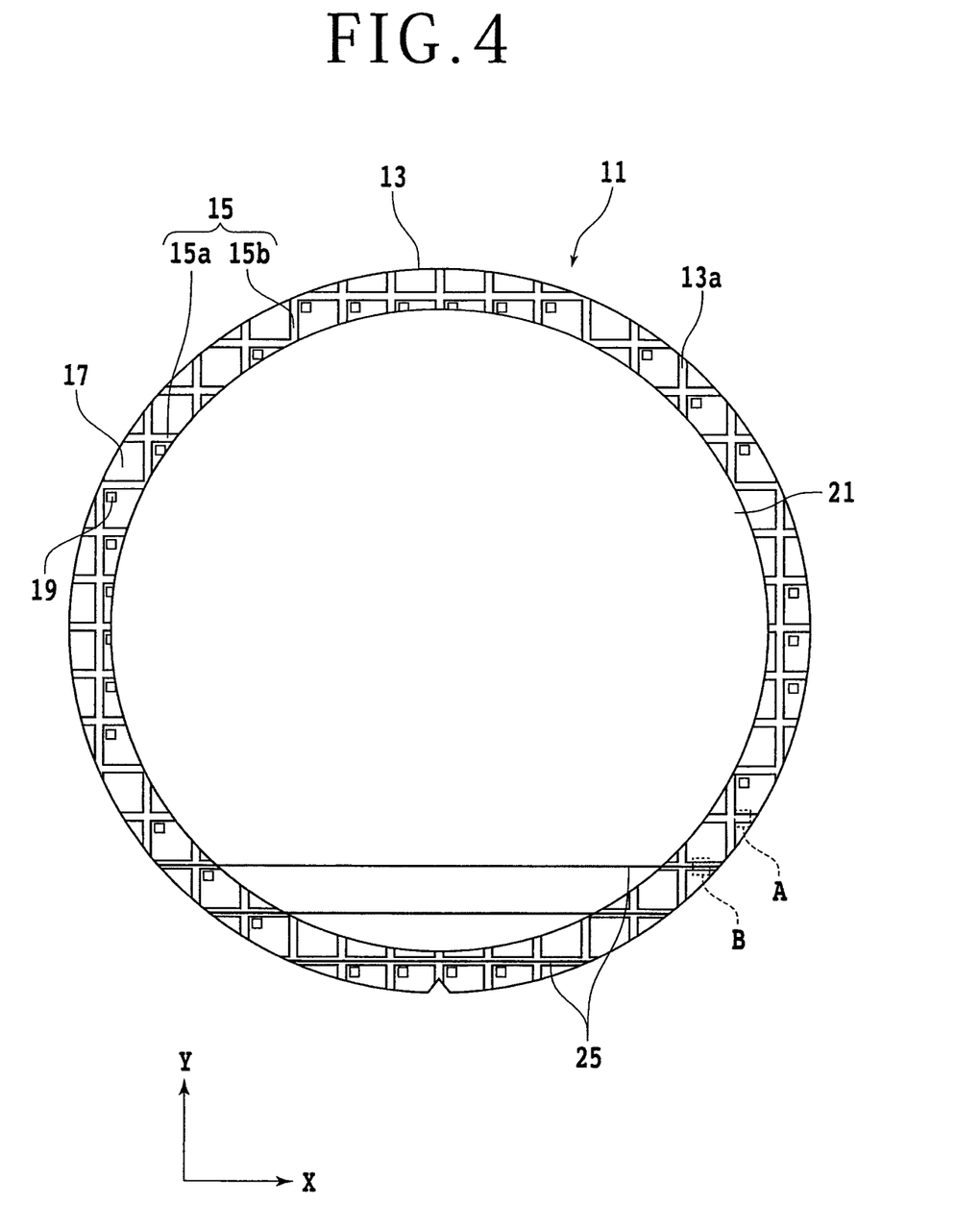
FIG. 4 is a plan view for illustrating a correcting step.

At any arbitrary time in the processing step, the correcting step is performed to correct the position of the laser beam applying unit 38 with respect to the target division line 15. FIG. 4 is a plan view for illustrating the correcting step. The correcting step will now be described in the case of forming the laser processed grooves 25 along the first division lines 15a. However, also in the case of forming the laser processed grooves 25 along the second division lines 15b, the correcting step can be similarly performed.

Figure 5A:
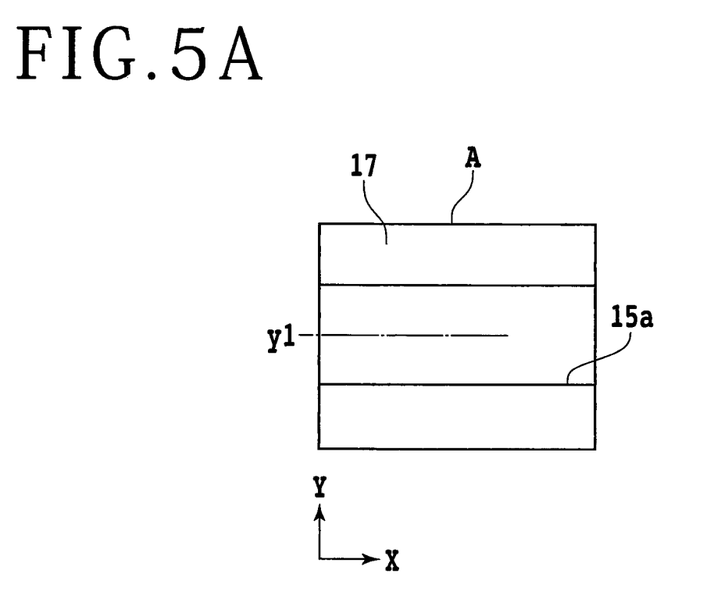
FIG. 5A is a plan view showing an image obtained by imaging an area including a first division line to be next processed to form a laser processed groove.
Figure 5B:
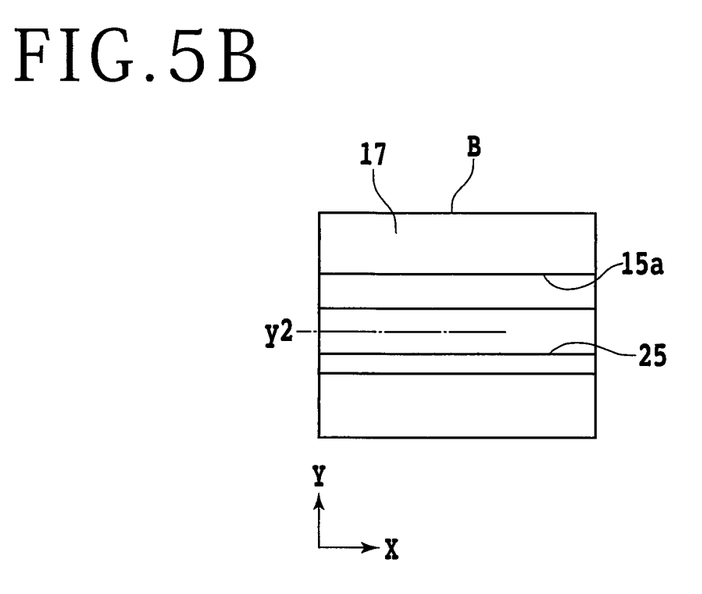
FIG. 5B is a plan view showing an image obtained by imaging an area including a laser processed groove just formed along the present first division line.

In performing the correcting step, the upper surface (front side 13a) of the packaged wafer 11 is imaged by the camera 40. More specifically, as shown in FIG. 4, an area A including the first division line 15a to be next processed to form the laser processed groove 25 and an area B including the laser processed groove 25 just formed along the present division line 15a are imaged by the camera 40, wherein these areas A and B are exposed to the peripheral portion of the packaged wafer 11. However, the areas B may be set at the central portion. FIG. 5A shows an image obtained by imaging the area A, and FIG. 5B shows an image obtained by imaging the area B.

After imaging the area A, a center coordinate y1 bisecting the first division line 15a in its lateral direction (Y direction) is determined according to the image of the area A shown in FIG. 5A. Further, a center coordinate y2 bisecting the laser processed groove 25 in its lateral direction (Y direction) is determined according to the image of the area B shown in FIG. 5B. The reason why the area A including the first division line 15a can be imaged to directly determine the center coordinate y1 as mentioned above is largely owing to the improvement in sensitivity of the camera 40 and the advance in control software in recent years.

Thereafter, the distance b (=y1−y2) between the first division line 15a in the area A and the laser processed groove 25 in the area B is determined from the center coordinate y1 of the first division line 15a and the center coordinate y2 of the laser processed groove 25, and a deviation of this distance b from the proper index amount a is calculated, wherein this deviation corresponds to the difference (a−b) between the proper index amount a and the distance b. Thereafter, a correction index amount c is calculated by using this deviation. More specifically, the difference (a−b) corresponding to the deviation is added to the index amount a to calculate the correction index amount c (=a+(a−b)=2a−b).

In the next indexing operation subsequent to this correcting step, the correction index amount c calculated above is used. Accordingly, the position of the laser beam applying unit 38 is corrected so as to coincide with the lateral center of the first division line 15a to be next processed, so that the accuracy of processing of the packaged wafer 11 can be maintained at a high level. After once performing the indexing operation using the correction index amount c, the original index amount a is restored to continue the processing step. In other words, the indexing operation using the correction index amount c is once performed by once performing the correcting step.

As described above, in the packaged wafer processing method according to the preferred embodiment, the next division line (street) 15 to be processed and the laser processed groove 25 just formed along the present division line 15 are imaged in the exposed peripheral portion of the packaged wafer 11 to determine the distance b between the next division line 15 and the laser processed groove 25 just formed along the present division line 15. Thereafter, the correction index amount c is calculated by using the deviation corresponding to the difference (a−b) between the index amount a and the distance b. Accordingly, it is unnecessary to use the key patterns 19 in the correcting step. That is, even in processing the packaged wafer 11 with a small number of key patterns 19 exposed, the position of the laser beam applying unit 38 with respect to each division line 15 can be properly corrected. Further, the distance b as an actual index amount is directly measured by imaging the division lines 15 without using the key patterns 19, so that the position of the laser beam applying unit 38 with respect to each division line 15 can be corrected more reliably with high accuracy. Thusly, according to the packaged wafer processing method of the preferred embodiment, even in processing the packaged wafer 11 with a small number of key patterns 19 exposed, the position of the laser beam applying unit 38 with respect to each division line 15 can be properly corrected.

The present invention is not limited to the above preferred embodiment, but various modifications may be made. For example, while the first division lines 15a extending in the first direction are made parallel to the X direction in the alignment step in the above preferred embodiment, the first division lines 15a may be made parallel to the Y direction in the alignment step according to the present invention. As a modification, the second division lines 15b extending in the second direction may be made parallel to the X direction or the Y direction in the alignment step according to the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A packaged wafer processing method of processing a packaged wafer by using a processing apparatus, said packaged wafer being composed of a wafer and a resin sealing a front side of said wafer in an area except a peripheral portion, wherein said resin on said front side of said wafer is defined as a resin layer and a plurality of electrodes are provided on an upper surface of said resin layer, the front side of said wafer being partitioned into a plurality of separate regions by a plurality of crossing division lines, wherein a device having a key pattern is formed in each separate region, said processing apparatus including a rotatable holding table for holding said packaged wafer, a laser beam applying unit for applying a laser beam having an absorption wavelength to said packaged wafer held on said holding table, a feeding mechanism for relatively moving said holding table and said laser beam applying unit in an X direction, an indexing mechanism for relatively moving said holding table and said laser beam applying unit in a Y direction perpendicular to said X direction, an imaging unit for imaging and detecting a target area of said packaged wafer to be processed, and a control unit for controlling said holding table, said laser beam applying unit, said feeding mechanism, said indexing mechanism, and said imaging unit, said packaged wafer processing method comprising:
   an alignment step of imaging said target area of said packaged wafer held on said holding table by using said imaging unit to make the direction of said division lines parallel to said X direction;
   a processing step of processing each division line by using said laser beam applying unit and said feeding mechanism and indexing said packaged wafer by a preset index amount "a" corresponding to the pitch of said division lines by using said indexing mechanism after performing said alignment step, thereby forming a laser processed groove along each division line, wherein said processing step includes applying said laser beam through said upper surface of said resin layer; and
   a correcting step of imaging a next division line to be processed in said peripheral portion of said wafer and said laser processed groove just formed along the present division line, at any arbitrary time during said processing step, next determining a distance "b" between said next division line and said laser processed groove formed along the present division line, and then calculating a correction index amount "c" by using a deviation corresponding to a difference (a−b) between said preset index amount "a" and said distance "b," wherein the distance "b" is determined without using said key patterns.

2. The packaged wafer processing method according to claim 1, wherein said correcting step includes imaging said laser processed groove formed in said resin.

3. The packaged wafer processing method according to claim 1, wherein:
   said key patterns are covered by said resin except in said peripheral portion; and
   during said alignment step, at least one of said key patterns in said peripheral region is relied upon to align the orientation of the packaged wafer such that the direction of said division lines is parallel to said X direction.

4. The packaged wafer processing method according to claim 1, wherein said distance "b" is determined from a portion of said laser processed groove just formed that is located in said peripheral portion of said packaged wafer.

5. The packaged wafer processing method according to claim 1, wherein said distance "b" is determined from a portion of said laser processed groove just formed that is located in a central portion of said packaged wafer, wherein said central portion of said packaged wafer is surrounded by said peripheral portion of said packaged wafer.

6. The packaged wafer processing method according to claim 1, wherein the processing apparatus applies the corrected index amount "c" to form a laser processed groove along said next division line and applies said preset index amount "a" for a subsequent division line after said next division line.

7. The packaged wafer processing method according to claim 1, wherein a location of said next division line is obtained via said imaging unit.

8. A packaged wafer processing method of processing a packaged wafer by using a processing apparatus, said packaged wafer being composed of a wafer and a resin sealing a front side of said wafer in an area except a peripheral portion, wherein said resin on said front side of said wafer is defined as a resin layer and a plurality of electrodes are provided on an upper surface of said resin layer, the front side of said wafer being partitioned into a plurality of separate regions by a plurality of crossing division lines, wherein a device having a key pattern is formed in each separate region, said processing apparatus including a rotatable holding table for holding said packaged wafer, a laser beam applying unit for applying a laser beam having an absorption wavelength to said packaged wafer held on said holding table, a feeding mechanism for relatively moving said holding table and said laser beam applying unit in an X direction, an indexing mechanism for relatively moving said holding table and said laser beam applying unit in a Y direction perpendicular to said X direction, an imaging unit for imaging and detecting a target area of said packaged wafer to be processed, and a control unit for controlling said holding table, said laser beam applying unit, said feeding mechanism, said indexing mechanism, and said imaging unit, said packaged wafer processing method comprising:
   an alignment step of imaging said target area of said packaged wafer held on said holding table by using said imaging unit to make the direction of said division lines parallel to said X direction;
   a processing step of processing each division line by using said laser beam applying unit and said feeding mechanism and indexing said packaged wafer by a preset index amount "a" corresponding to the pitch of said division lines by using said indexing mechanism after performing said alignment step, thereby forming a laser processed groove along each division line, wherein said processing step includes applying said laser beam through said upper surface of said resin layer; and a correcting step of imaging a next division line to be processed in said peripheral portion of said wafer and said laser processed groove just formed along the present division line, at any arbitrary time during said processing step, next determining a distance "b" between said next division line and said laser processed groove formed along the present division line, and then calculating a correction index amount "c" by using a deviation corresponding to a difference (a−b) between said preset index amount "a" and said distance "b," wherein the distance "b" is determined without using said key patterns;

wherein said key patterns are covered by said resin except in said peripheral portion;

wherein during said alignment step, at least one of said key patterns in said peripheral region is relied upon to align the orientation of the packaged wafer such that the direction of said division lines is parallel to said X direction; and wherein said distance "b" is determined from a portion of said laser processed groove just formed that is located in said peripheral portion of said packaged wafer.

9. A packaged wafer processing method of processing a packaged wafer by using a processing apparatus, said packaged wafer being composed of a wafer and a resin sealing a front side of said wafer in an area except a peripheral portion, wherein said resin on said front side of said wafer is defined as a resin layer and a plurality of electrodes are provided on an upper surface of said resin layer, the front side of said wafer being partitioned into a plurality of separate regions by a plurality of crossing division lines, wherein a device having a key pattern is formed in each separate region, said processing apparatus including a rotatable holding table for holding said packaged wafer, a laser beam applying unit for applying a laser beam having an absorption wavelength to said packaged wafer held on said holding table, a feeding mechanism for relatively moving said holding table and said laser beam applying unit in an X direction, an indexing mechanism for relatively moving said holding table and said laser beam applying unit in a Y direction perpendicular to said X direction, an imaging unit for imaging and detecting a target area of said packaged wafer to be processed, and a control unit for controlling said holding table, said laser beam applying unit, said feeding mechanism, said indexing mechanism, and said imaging unit, said packaged wafer processing method comprising:

an alignment step of imaging said target area of said packaged wafer held on said holding table by using said imaging unit to make the direction of said division lines parallel to said X direction;

a processing step of processing each division line by using said laser beam applying unit and said feeding mechanism and indexing said packaged wafer by a preset index amount "a" corresponding to the pitch of said division lines by using said indexing mechanism after performing said alignment step, thereby forming a laser processed groove along each division line, wherein said processing step includes applying said laser beam through said upper surface of said resin layer; and a correcting step of imaging a next division line to be processed in said peripheral portion of said wafer and said laser processed groove just formed along the present division line, at any arbitrary time during said processing step, next determining a distance "b" between said next division line and said laser processed groove formed along the present division line, and then calculating a correction index amount "c" by using a deviation corresponding to a difference (a−b) between said preset index amount "a" and said distance "b," wherein the distance "b" is determined without using said key patterns;

wherein said key patterns are covered by said resin except in said peripheral portion;

wherein during said alignment step, at least one of said key patterns in said peripheral region is relied upon to align the orientation of the packaged wafer such that the direction of said division lines is parallel to said X direction; and wherein said distance "b" is determined from a portion of said laser processed groove just formed that is located in a central portion of said packaged wafer, wherein said central portion of said packaged wafer is surrounded by said peripheral portion of said packaged wafer.

10. The packaged wafer processing method according to claim 8, wherein the processing apparatus applies the corrected index amount "c" to form a laser processed groove along said next division line and applies said preset index amount "a" for a subsequent division line after said next division line.

11. The packaged wafer processing method according to claim 9, wherein the processing apparatus applies the corrected index amount "c" to form a laser processed groove along said next division line and applies said preset index amount "a" for a subsequent division line after said next division line.

* * * * *